United States Patent
Eilenberger et al.

(10) Patent No.: US 12,339,297 B2
(45) Date of Patent: Jun. 24, 2025

(54) MEASUREMENT OF A SEQUENCE OF RECURRING ELECTRONIC SIGNALS

(71) Applicants: Fraunhofer-Gesellschaft zur Förderung der angewandten Forschung e.V., Munich (DE); Friedrich-Schiller-Universität Jena, Jena (DE)

(72) Inventors: Falk Eilenberger, Jena (DE); Tobias Vogl, Jena (DE)

(73) Assignees: Fraunhofer-Gesellschaft zur Förderung der angewandten Forschung e.V. (DE); Friedrich-Schiller-Universitat Jena (DE)

( * ) Notice: Subject to any disclaimer, the term of this patent is extended or adjusted under 35 U.S.C. 154(b) by 193 days.

(21) Appl. No.: 18/267,338

(22) PCT Filed: Dec. 15, 2021

(86) PCT No.: PCT/EP2021/085894
§ 371 (c)(1),
(2) Date: Jun. 14, 2023

(87) PCT Pub. No.: WO2022/129173
PCT Pub. Date: Jun. 23, 2022

(65) Prior Publication Data
US 2024/0044943 A1 Feb. 8, 2024

(30) Foreign Application Priority Data
Dec. 15, 2020 (DE) .......................... 102020133467.2

(51) Int. Cl.
*G01R 13/02* (2006.01)
(52) U.S. Cl.
CPC .................................. *G01R 13/02* (2013.01)

(58) Field of Classification Search
USPC ....................................................... 324/76.47
See application file for complete search history.

(56) References Cited

U.S. PATENT DOCUMENTS

| 8,024,142 B1 | 9/2011 | Gagnon et al. |
| 2013/0207824 A1 | 8/2013 | Waters et al. |

(Continued)

FOREIGN PATENT DOCUMENTS

| DE | 10231155 A1 | 1/2003 |
| DE | 102006018450 A1 | 10/2006 |

OTHER PUBLICATIONS

International Search Report for PCT/EP2021/085894 mailed Apr. 20, 2022. 3 pgs.

*Primary Examiner* — Farhana A Hoque
(74) *Attorney, Agent, or Firm* — Lerner David LLP

(57) ABSTRACT

A method for measurement of a sequence of recurring electronic signals (10) is proposed, wherein the sequence to be measured consists of n recurring electronic signals, wherein a time-to-digital converter (2) and a memory (5) are provided. In this regard, it is essential that, to measure the sequence for an i-th signal of the sequence, a voltage $U_i$ is specified and a time $t_i$ at which the i-th signal (10) has the specified voltage $U_i$ is measured on the basis of the specified voltage $U_i$, with the following steps, preferably in this order:

i) inputting an i-th signal of the sequence into a first channel of the time-to-digital converter (2);
ii) specifying an i-th voltage $U_i$ and specifying a start time $t_{start\_i}$ for starting a measurement;
iii) measuring the time $t_i$ at which the i-th signal has the specified voltage $U_i$;
iv) storing the specified voltage $U_i$ and the measured time $t_i$;
v) repeating steps i) and iv) using an i+1-th signal (10) and a voltage $U_{i+1}$;

(Continued)

vi) reconstructing the recurring electronic signal (10) from the stored measured values.

14 Claims, 6 Drawing Sheets

(56) References Cited

U.S. PATENT DOCUMENTS

| | | |
|---|---|---|
| 2016/0365868 A1 | 12/2016 | Pickerd |
| 2018/0299491 A1 | 10/2018 | Holaday et al. |
| 2019/0033431 A1 | 1/2019 | Haneda et al. |
| 2019/0277887 A1* | 9/2019 | Landolt .................. H03K 5/135 |

\* cited by examiner

MEASUREMENT OF A SEQUENCE OF RECURRING ELECTRONIC SIGNALS

CROSS REFERENCE TO RELATED APPLICATIONS

The present application is a national phase entry under 35 U.S.C. § 371 of International Application No. PCT/EP2021/085894 filed on Dec. 15, 2021, published as WO 2022/129173 A1, which claims priority from German Patent Application No. 10-2020-133-467.2 filed on Dec. 15, 2020, all of which are hereby incorporated herein by reference in their entireties.

BACKGROUND AND SUMMARY

The invention relates to a method for measurement of a sequence of recurring electronic signals according to the features of the preamble of claim 1, and to a device for measurement of a sequence of recurring electronic signals according to the features of the preamble of claim 14.

Precisely measuring electronic signals is one of the fundamental tasks in physics, electrical engineering or telecommunications engineering, for which purpose digital storage oscilloscopes (DSO) are used, among other things. A digital storage oscilloscope samples the electrical signal to be measured using an analog-to-digital converter (A/D, A/D converter, ADC). The sampling is carried out, i.e. the voltage is measured, in temporally discrete intervals of the so-called sample rate, which are specified by the analog-to-digital converter. At the resolution specified by the sample rate, the analog-to-digital converter converts the analog electrical signal having a continuous time and a continuous amplitude (voltage) into a digital signal having a discrete time (specified by the sample rate) and a discrete amplitude (measured voltage).

Digital storage oscilloscopes can be classified in two categories: real-time oscilloscopes and sampling oscilloscopes.

In real-time oscilloscopes, the signal is sampled and digitalized at mostly equidistant intervals. In known oscilloscopes, the sample rate is relatively high. At the same time, the sample rate has to be considerably shorter than the period of the signal, whereby a very rapid analog-to-digital converter (ADC) is required for high-frequency signals. The advantage of a real-time oscilloscope is that the signal can be reconstructed from just a single pulse.

In sampling oscilloscopes, usually only one voltage value is digitalized per trigger cycle, i.e. per signal. For this purpose, the sampling time is shifted starting from the trigger signal by one unit of time (specified by the sample rate) in each signal cycle. As a result, the signal of a recurring pulse can be reconstructed after a plurality of cycles. However, sampling oscilloscopes cannot detect rapid pulse fluctuations.

The resolution of an oscilloscope is indicated by the bandwidth $f_{bw}$ and, to obtain precise time measurements, should be at least double the highest frequency component of the signal (Nyquist-Shannon sampling theorem). In this respect, the bandwidth describes the frequency range of a signal that can pass through the analog input with minimal amplitude attenuation, i.e. can pass from a probe tip or probe head d of the testing device to the input of the A/D converter. The bandwidth is defined as the frequency at which a sinusoidal input signal is attenuated to 70.7% of its original size, which is also referred to as the −3 Db limit. The bandwidth can also be defined by the rise time $t_{rise}$ of a signal amplitude from 10% of the signal to 90% and is determined by $t_{rise}=k/f_{bw}$. In this case, the factor k is typically indicated by a value between 0.3 and 0.45, wherein the factor k is selected towards the value 0.3 for a bandwidth in the GHz range. Standard oscilloscopes have a bandwidth from 100 MHz to 500 MHz. To resolve a signal having a rise time in the ps range, a bandwidth of more than 100 GHz is required.

The object of the present invention is to provide an improved method, in particular a more precise and more cost-effective method, and a device of that kind for measurement of a sequence of recurring electronic signals. In particular, signals having high frequencies and/or low rise times should also be able to be measured.

According to the invention, the object is achieved by a method for measurement of a sequence of recurring electronic signals according to the features of claim 1.

According to the invention, a method for measurement of a sequence of identical or similar electronic signals is proposed.

Method for measurement of a sequence of recurring electronic signals, wherein the sequence to be measured consists of n recurring electronic signals, where I=1 to n, wherein a time-to-digital converter and a memory, and preferably a microprocessor, is provided,
  wherein to measure the sequence for an i-th signal of the sequence, a voltage $U_i$ is specified, and a time $t_i$ at which the i-th signal has the specified voltage $U_i$ is measured on the basis of the specified voltage $U_i$, with the following steps, preferably in this order:
  i) inputting an i-th signal of the sequence into a first channel of the time-to-digital converter;
  ii) specifying an i-th voltage $U_i$ and specifying a start time $t_{start\_i}$ for starting a measurement of the i-th signal;
  iii) measuring the time $t_i$ at which the i-th signal has the specified voltage $U_i$;
  iv) storing the specified voltage $U_i$ and the measured time $t_i$, and/or the start time $t_{start\_i}$ and the measured time $t_i$, and/or the time difference between the start time $t_{start\_i}$ and the measured time $t_i$;
  v) repeating steps i) and iv) using an i+1-th signal and a voltage $U_{i+1}$, preferably until I+1=n or until the specified voltage $U_i$ is greater than the maximum voltage $U_{max}$ of the signal;
  vi) reconstructing the recurring electronic signal from the stored measured values of the voltage $U_i$, the start time $t_{start\_i}$ and the time $t_i$.

In addition, the object is achieved by a device for measurement of a sequence of recurring electronic signals according to the features of claim 14.

According to the invention, a device for measurement of a sequence of recurring electronic signals is proposed, wherein the device comprises a time-to-digital converter (TDC), a microprocessor connected thereto, a memory that can be written to by the microprocessor and/or the time-to-digital converter (TDC), a comparator arranged in or connected to the time-to-digital converter (TDC), and an output unit,
  wherein the comparator measures whether the signal sequence of recurring electronic signals has the specified voltage $U_i$, and the time-to-digital converter establishes a time $t_i$ at which the signal sequence has the predetermined voltage $U_i$, and
  wherein the specified voltage $U_i$ and the established time $t_i$ and/or a start time $t_{start\_i}$ is stored in the memory, and
  wherein the microprocessor reconstructs the sequence of recurring electronic signals on the basis of the values in the memory and sends it to the output unit and/or visually displays it thereon.

Using the method according to the invention and the device according to the invention, the time resolution of the measurement is no longer limited by the specified temporally discrete intervals of the analog-to-digital converter, i.e. is no longer limited to the time-based sample rate. In the method according to the invention and the device according to the invention, the voltage $U_i$ at which a measurement is to be carried out is specified rather than the time at which a measurement is to be carried out, as is the case in known oscilloscopes. The advantage in this respect is that establishing whether a voltage $U_i$ is present can be done more rapidly and to a higher degree of accuracy compared with time-discrete sampling.

Through the method according to the invention and the device according to the invention, more cost-effective components can be used for an improved time resolution of a recurring electronic signal. At the same time, specifying the voltage $U_i$ can lead to an improvement many times over in the time resolution of the measurement, which allows the signal to be reconstructed with an improved signal-to-noise ratio (S/N ratio).

By recurring electronic signals are meant signals that do not differ from one another either significantly or at all in terms of time-dependent formation and voltage curve, at least during the measurement period. Preferably, this means that the difference between the signals is less than the time resolution or voltage resolution of the method or device, or that owing to a difference in the time-dependent formation and voltage curve of individual signals, the measurement can be performed to an accuracy with the time resolution or voltage resolution of the method or device. In this context, the accuracy of the time resolution and voltage resolution depends on the electronic components used. Owing to differences, an average value is obtained by measuring the differing signals.

It can be provided that the sequence of electronic signals is configured as a periodic signal sequence, preferably as electronic signals or pulses occurring successively over time, wherein preferably the time gap between the signals or pulses can be the same or different. It can be provided that the electronic signal has a time-dependent voltage curve U (t).

It can be provided that the recurring electronic signals repeat at a frequency that is less than or equal to the upper frequency of the time-to-digital converter. For example, the limit frequency of the time-to-digital converter can be 20 MHz or 50 MHz and the recurring electronic signals can repeat at a frequency of at most 20 MHz, preferably 50 MHz, preferably at a frequency of which the period duration is greater than the delay time of the time-to-digital converter. The delay time is the time period within which no further measurement can be performed by the electronic components, preferably the comparator.

It is also possible for the recurring electronic signals to have a frequency greater than 50 MHz, preferably greater than 500 MHz, preferably up to 1 GHz, wherein at such frequencies, a frequency divider is arranged upstream of the time-to-digital converter. Preferably, the division ratio of the frequency divider is selected such that the divider reduces the frequency of the recurring electronic signals down to the input frequency of the time-to-digital converter, preferably to at most 20 MHz, preferably 50 MHz.

By inputting an i-th signal of the sequence in step i) is meant that the i-th signal of the sequence is read out from the sequence of n recurring electronic signals that is to be measured, preferably that it is transferred to the first channel of the time-to-digital converter.

It can be provided that a frequency divider, preferably an adjustable or programmable frequency divider, is arranged upstream of the time-to-digital converter. In particular, the frequency divider has a division factor k and the time-to-digital converter measures only every k-th signal. Preferably, the division factor k of the frequency divider is specified or set such that every k-th signal is no longer within the delay time of the time-to-digital converter. This makes it possible to measure recurring electronic signals that repeat at a frequency of which the period duration is less than or significantly less than the delay time of the time-to-digital converter. Relatively cost-effective time-to-digital converters can thus be used, even at high frequencies, and it is also possible to resolve high-frequency signals.

It can be provided that the measurement in step iii) is performed for the rising and/or falling flank of the i-th signal.

It can be provided that steps i) to iv) are repeated at the same specified voltage $U_i$ in an i-th signal for a rising flank and in an i+1-th signal for a falling flank. In that case, for step v), steps i) and iv) are preferably repeated using an i+2-th signal and a voltage $U_{i+1}$, preferably until 2*I=n or until the specified voltage $U_i$ is greater than the maximum voltage $U_{max}$ of the signal.

It can be provided that the specified voltage $U_i$ is increased incrementally for each further i-th measurement, wherein the steps can be constant or non-constant. Preferably, $U_{i+1}=U_i+\Delta U$, wherein $\Delta U$ represents the voltage increase. Preferably, $\Delta U$ is constant or variable for different i.

It can be provided that the time-to-digital converter measures times or a time period for each $U_i$, preferably in step iii), wherein the times are the start time $t_{start\_i}$ and/or the measured time $t_i$, and the time period is the difference between the start time $t_{start\_i}$ and the measured time $t_i$.

It can be provided that in step iii), the time $t_i$ is measured in the time-to-digital converter.

It can be provided that in step iii) for measuring the time $t_i$, the specified voltage $U_i$ is compared with the i-th signal, is preferably compared in the time-to-digital converter or in the comparator.

It can be provided that the time-to-digital converter establishes the time $t_i$ using a specified voltage threshold which corresponds to the specified voltage $U_i$, or in that the time-to-digital converter establishes the time $t_i$ using a trigger signal of a comparator.

It can be provided that the specified voltage $U_i$ is specified by the time-to-digital converter, or that the specified voltage $U_i$ is specified by a preferably adjustable and/or programmable reference source or by a digital-to-analog converter and is transmitted to the time-to-digital converter or to the comparator. It can be provided that the digital-to-analog converter is arranged in the time-to-digital converter or is arranged upstream of the time-to-digital converter.

It can be provided that the time-to-digital converter has a comparator and/or a digital-to-analog converter, or that a comparator and/or a digital-to-analog converter is arranged upstream of the time-to-digital converter. In this case, the comparator is used for comparing the specified voltage with the signal. The digital-to-analog converter is used for specifying the specified voltage $U_i$ to the digital-to-analog converter or the comparator.

It can be provided that each i-th signal of the sequence is fed into the first channel of the time-to-digital converter and steps i) to vi) are carried out, or that x time-to-digital converters or one time-to-digital converter with x channels are used in the method and/or are arranged in the device, wherein each of the x time-to-digital converters or channels carries out steps i) to vi), wherein it is preferably provided that x≤I, wherein for x<I the x time-to-digital converters each carry out steps i) to vi) I/x times.

It can be provided that the comparator and/or the time-to-digital converter has a resolution of at least 1 Mv, preferably 1 µV, at most preferably 10 Nv.

It can be provided that the recurring electronic signal is input directly into the time-to-digital converter, or
  that a filter and/or amplifier and/or signal divider and/or power divider and/or attenuation member is arranged upstream of the time-to-digital converter.

It can be provided that the signal divider and/or power divider divides the electronic signal into two electronic signals or two signal paths, preferably into a first divided electronic signal and a second divided electronic signal.

It can be provided that the signal divider and/or power divider divides the electronic signal such that the first divided electronic signal and the second divided electronic signal have the same voltage ratio or such that the divided signals have a different voltage ratio, for example a voltage ratio between 1:1 and 1:2, preferably between 1:2 and 1:3, at most preferably between 1:3 and 1:5.

It can be provided that the first divided electronic signal is fed into a first channel of the time-to-digital converter and the second divided electronic signal is fed into a second channel of the time-to-digital converter, or the second divided electronic signal is fed into a second time-to-digital converter. Preferably, both the first and the second divided electronic signal are used for the measurement of steps i) to vi).

It can be provided that in step ii), a start time $t_{start}$ is specified by a start signal.

It can be provided that the start signal is specified by the time-to-digital converter or an external clock. In this case, it can be provided that the external clock is derived from a further signal or is generated from the microprocessor or generated by an external signal generator. Preferably, the start signal of the external clock is transmitted to the time-to-digital converter in order to specify the start time $t_{start}$.

It can be provided that the start signal
  is a further signal of a start signal channel, preferably generated by an external clock or by the signal divider and/or power divider, or
  is a start signal that is generated and/or defined internally in the device, preferably by the microprocessor or a clock generator or another electronic component.

It can be provided that the start time $t_{start}$ occurs for all the signals of a sequence at a fixed instant before or during each signal, or
  that the instant of the start time $t_{start}$ varies for different signals before or during the signal. The advantage of a fixed instant is that it is simple to reconstruct the recurring electronic signal. The advantage of the variation is that even more complex signal sequence, in particular variable signals having a plurality of rising and/or falling flanks, can be measured and reconstructed.

It can be provided that the start signal or the second divided electronic signal is fed into a second channel of the time-to-digital converter, preferably that the second divided electronic signal is transmitted to the time-to-digital converter as a start signal or is used in the time-to-digital converter. It can be provided that the time-to-digital converter for the second channel has a second comparator and/or a second digital-to-analog converter, or that an external second comparator and/or an external second digital-to-analog converter is arranged for the second channel.

It can be provided that the second divided electronic signal constitutes the start signal, preferably, the start time $t_{start}$ is specified by the second divided electronic signal. Preferably, the start signal voltage $U_{start}$, by which the start time $t_{start}$ is established from the second divided electronic signal, can be freely selected, most preferably the start signal voltage $U_{start}$ corresponds to half the voltage of the second divided electronic signal. Preferably, the start signal voltage $U_{start}$ is specified by an adjustable and/or programmable reference source or is specified by a digital-to-analog converter.

It can be provided that the first divided electronic signal and/or the second divided electronic signal is delayed by a specified or adjustable time either upstream of or in the time-to-digital converter. Preferably, the delay is specified in a fixed manner, preferably by cable routing having a specific cable length, or electronically, preferably by programming or a time-delay element.

It can be provided that the first and the second divided electronic signal are fed into the first channel of the time-to-digital converter by delaying the second divided electronic signal. Preferably, the start time $t_{start}$ and the measured time $t_i$ of the signal or the time difference $t_i - t_{start}$ are stored.

It can be provided that steps i) to iv) are repeated at the same voltage $U_i$ for a plurality of signals j, are preferably repeated before step v), are preferably repeated j times, in order to measure the times $t_{ij}$. In this case, j=1 to m, where j is an integer. It is thus possible to achieve a better time resolution that is below the jitter (fluctuation over time) of the time-to-digital converter.

It can be provided that an average value $U_{i\_ave}$ is calculated from the plurality of times $t_{ij}$ of the same voltage $U_i$ for a plurality of signals j. Preferably, the calculation is established from an estimate of the distribution of the measured values by way of averaging or extracting the average. It is thus possible to further improve the resolution of the method and device.

It can be provided that values between the stored measured values of the time $t_i$ are estimated by an interpolation algorithm in order to reconstruct the recurring electronic signal. In the case of weak signals in particular, this enables improved measurement or reconstruction of the signals.

It can be provided that the output unit is configured as a screen. It can be provided that the reconstructed recurring electronic signal is visually displayed on the output unit.

It can be provided that the recurring electronic signal is directly available electronically or is converted into an electronic signal by a converter. Preferably, a detector, an antenna, an amplifier or a device that converts a measured variable into an electronic signal can be used as the converter. Preferably, the detector can be configured as a fast-recovery photodiode for measuring optical signals. Alternatively, the detector can be configured as an antenna for measuring a magnetic or electromagnetic signal.

It can be provided that the time-to-digital converter is formed as a separate component and/or as an FPGA-based (field-programmable gate array) time-to-digital converter. A field-programmable gate array is an integrated circuit in which a logical circuit can be loaded. In the process, not only can the time sequences be programmed, but also desired circuit topologies can be defined.

It can be provided that the first divided electronic signal and/or the second divided electronic signal is delayed in the FPGA-based time-to-digital converter. It is thus possible to freely select and also to vary a delay between the first and the second divided electronic signal.

One application of the method according to the invention can be used for example for operating oscilloscopes or integrated in an oscilloscope as a measurement method. The device according to the invention can be configured as an oscilloscope or can be formed as an insert or as an additional component part for an oscilloscope. As part of the application of the method according to the invention, the method according to the invention can also be integrated in a TDC, preferably a pre-installed or pre-existing TDC, as an additional measurement method, for example as a measurement module and/or as a measurement program.

BRIEF DESCRIPTION OF THE DRAWINGS

Further embodiments of the invention are represented in the figures and described in the following. In the figures, a possible design of the invention is shown by way of example. This design serves to explain a possible implementation of the invention and is not to be understood to be limitative. There are shown in:

FIG. 1 shows a schematic representation of a first embodiment example of the device 1 according to the invention for measurement of a sequence of recurring electronic signals.

DETAILED DESCRIPTION

Using a probe head 7, a sequence of recurring electronic signals 10 is input into a time-to-digital converter 2 via a line. The sequence consists of n recurring electronic signals 10, where n is an integer. The individual signals 10 of the sequence reach the time-to-digital converter 2 one after the other, wherein the i-th signal 10 describes an individual signal 10 of the sequence, where i=1, 2 . . . n. By inputting an i-th signal 10 of the sequence is meant that the i-th signal 10 of the sequence is read out from the sequence of n recurring electronic signals 10 that is to be measured, i.e. that it is transferred to the first channel of the time-to-digital converter 2.

Figure 1:
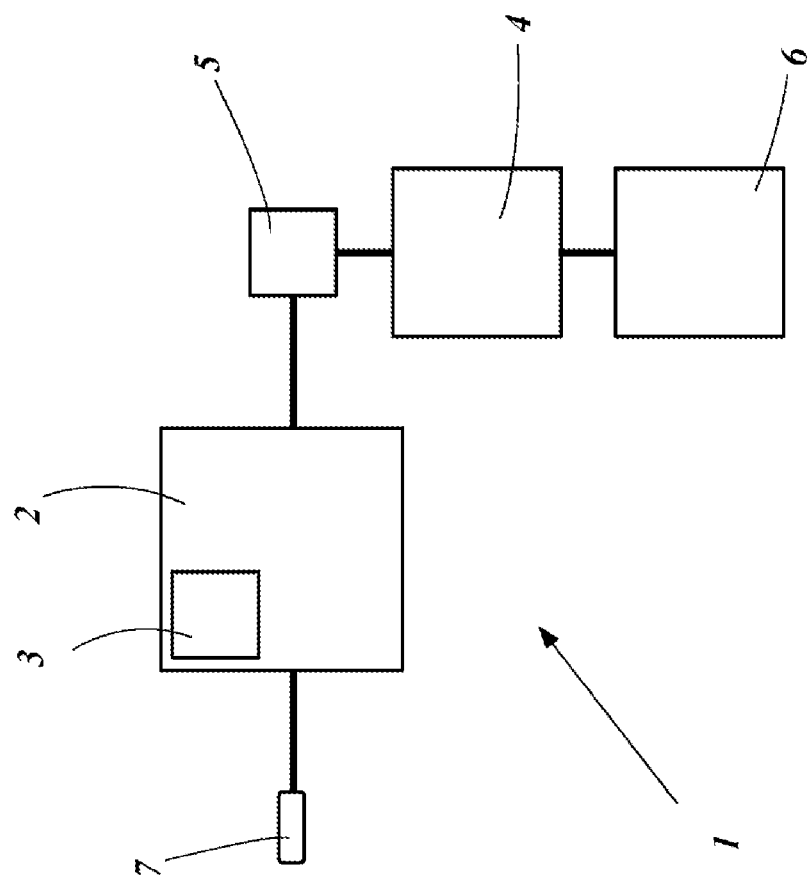
FIG. 1: a schematic representation of a first embodiment example of the device according to the invention.

The time-to-digital converter 2, which includes a comparator 3 in the embodiment example of FIG. 1, measures the time $t_i$ at which the i-th signal 10 has a specified voltage $U_i$. In the embodiment example of FIG. 1, the time-to-digital converter 2 specifies a start signal, which starts the method according to the invention or defines a start time $t_{start}$ for each i-th signal 10 so as to define a respective reference start time for the subsequent evaluation of the measured data of the plurality of signals 10. The specified voltage $U_i$ is specified by the time-to-digital converter 2 in the embodiment example of FIG. 1. Embodiments in which the specified voltage $U_i$ is specified by a reference source 9 and transmitted to the time-to-digital converter 2 or to the comparator 3 are also possible (see FIG. 2). To measure the instant $t_i$ at which the signal 10 has the specified voltage $U_i$, the comparator 3 compares the specified voltage $U_i$ with the i-th signal 10. The comparator 3 generates an electronic pulse when the recurring signal 10 has the specified voltage $U_i$, and transmits it to the time-to-digital converter 2, which establishes the time $t_i$ and relays it to a memory 5.

In the memory 5, the times $t_i$ and the corresponding specified voltages $U_i$ are stored and then evaluated by the microprocessor 4. In addition, the start time $t_{start}$ for each recurring signal 10 and/or the time period between $t_i$ and $t_{start}$ can be stored. The evaluated data are displayed on an output unit 6, which can be configured as a monitor.

Figure 2:
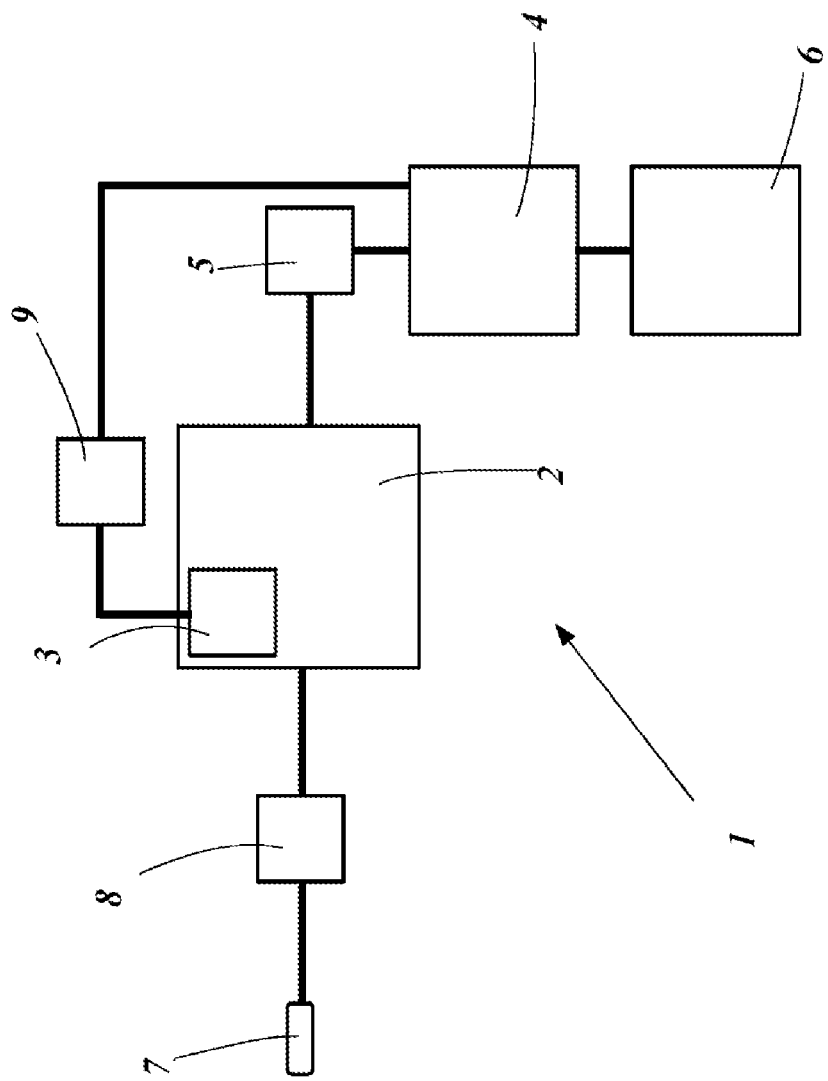
FIG. 2: a schematic representation of a second embodiment example of the device according to the invention with a frequency divider.

FIG. 2 shows a second embodiment example of the device 1 according to the invention. By contrast with FIG. 1, the specified voltage $U_i$ is transmitted to the comparator 2 from a reference source 9. In this embodiment example, the reference source 9 is formed as a separate component outside the time-to-digital converter 2. In the embodiment example of FIG. 2, the reference source 9 is controlled by the microprocessor in order to specify the voltage $U_i$ for each i-th signal.

In addition, by contrast with FIG. 1, a frequency divider 8 is arranged upstream of the time-to-digital converter 2 in FIG. 2. The frequency divider 8 makes it possible to measure a sequence of recurring signals 10 which have a frequency between the signals 10 that is greater than the delay time of the time-to-digital converter 2. The frequency divider 8 factorizes the recurring signals 10 and relays only every k-th recurring signal 10 to the time-to-digital converter 2, which signal is then used in the time-to-digital converter 2 for the measurement. It should be noted that the frequency divider 8 and also the reference source 9 can be formed on their own in the embodiment example of FIG. 2.

Figure 3:
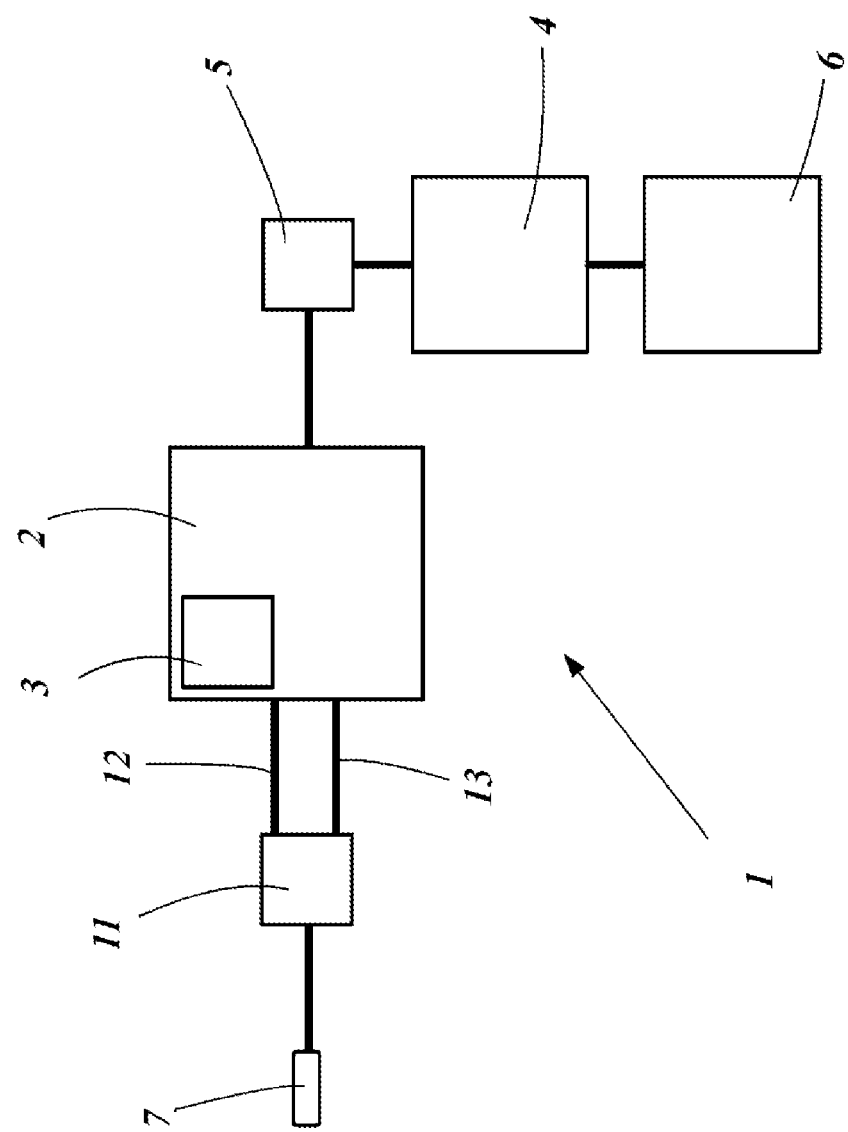
FIG. 3: a schematic representation of a third embodiment example of the device according to the invention with a signal divider.

FIG. 3 shows a third embodiment example of the device 1 according to the invention. By contrast with FIG. 1, a signal divider 11 is arranged upstream of the time-to-digital converter 2, which divides each signal 10 of the sequence into two signals, a first i-th electronic signal 12 and a second i-th electronic signal. In the embodiment example of FIG. 3, the first i-th electronic signal 12 is input into a first channel of the time-to-digital converter 2, and the second i-th electronic signal 13 is input into a second channel of the time-to-digital converter 2. In the embodiment example of FIG. 3, the second i-th electronic signal 13 is used for determining the start time $t_{start}$. For this purpose, in the time-to-digital converter 2 there is formed a second comparator 3 (not represented in FIG. 3), which receives a start voltage $U_{start}$ from the time-to-digital converter 2 and establishes therefrom the start time $t_{start}$ at which the measurement is started, or defines a start time $t_{start}$ for each i-th signal 10 in order to define a respective reference start time for the subsequent evaluation of the measured data of the plurality of signals 10. In the embodiment example of FIG. 3, the first i-th electronic signal 12 is delayed with respect to the second i-th electronic signal 13 (see FIG. 5). The delay is carried out so that, first, the time-to-digital converter 2 in this embodiment example establishes the start time $t_{start}$, and then the time $t_i$ is measured. The delay can be implemented electronically in the time-to-digital converter 2 or by corresponding cable routing upstream of or in the time-to-digital converter 2.

Figure 4:
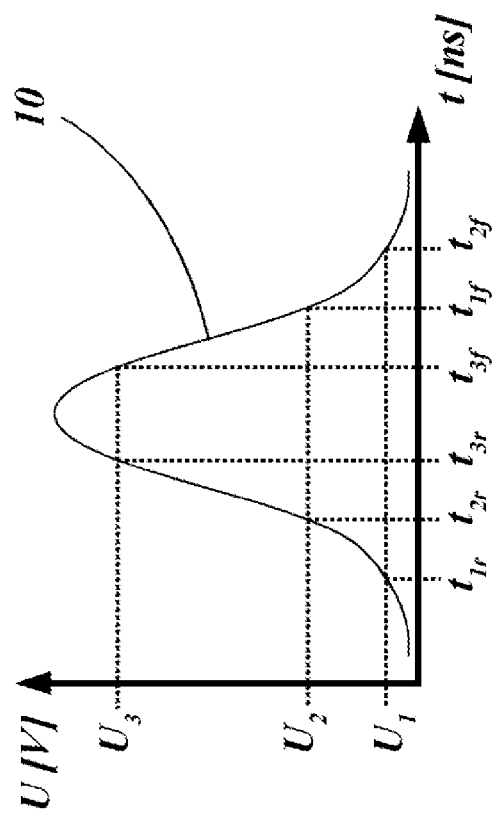
FIG. 4: a schematic representation of a recurring electronic signal with specified voltages.

FIG. 4 shows a recurring signal 10 by way of example, as well as the specified voltages $U_1$, $U_2$ and $U_3$ and the times $t_i$, obtained by the measurements, for the rising and falling flanks of the signal 10. It should be noted in this case that the plurality of measurements of the times $t_i$ are not carried out on one signal 10, but rather a distinct i-th signal 10 is used for each measurement.

Figure 5:
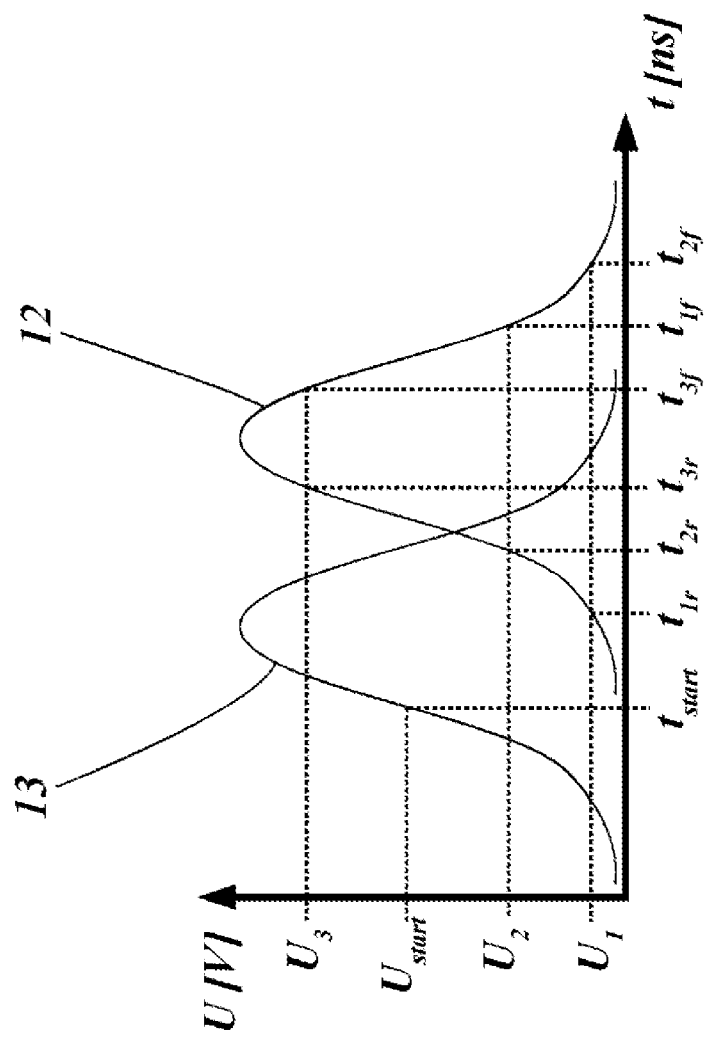
FIG. 5: a schematic representation of a first and a second electronic signal with specified voltages and start time determination.

FIG. 5 shows the first electronic signal 12 and the second electronic signal 13 for determining the start time $t_{start}$ and for measuring the times $t_i$ of the rising and falling flank of the signal 10 for the voltages $U_1$, $U_2$ and $U_3$. The first electronic signal 12 and the second electronic signal 13 can be obtained by a device as described by way of example in FIG. 3. In this case, the first electronic signal 12 has been input into the time-to-digital converter 2 in a manner delayed with respect to the second electronic signal 13, or it is delayed in the time-to-digital converter 2. Thus, using the second electronic signal 13 and the specification of the start voltage $U_{start}$, a start time $t_{start}$ is established by the distinct recurring signal 10.

Figure 6:
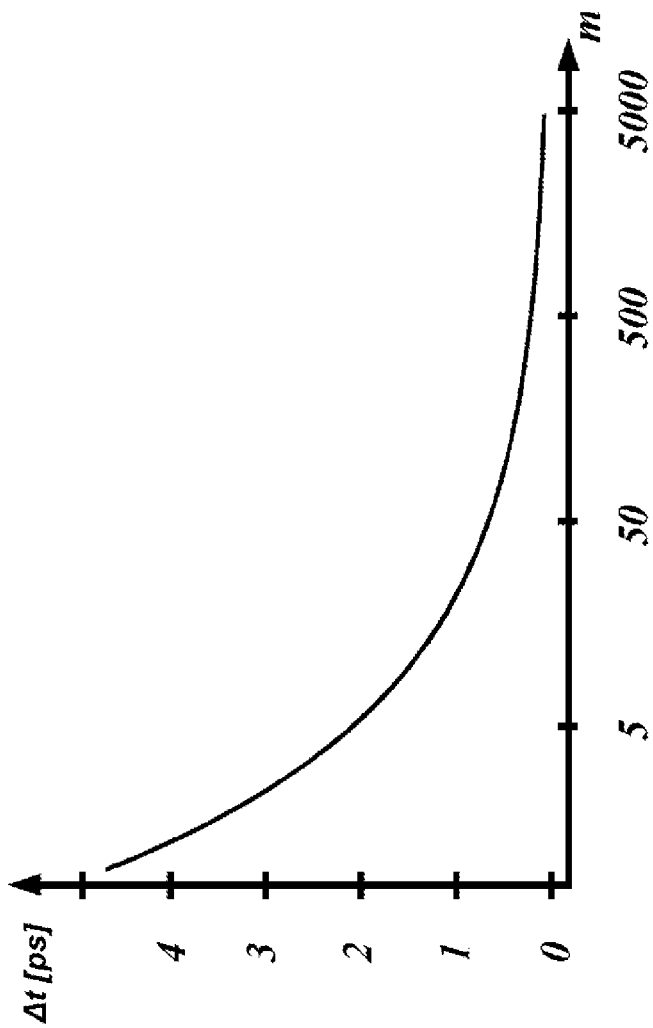
FIG. 6: a graph showing the improvement in the time resolution $\Delta t$ of the method according to the invention on the basis of the repeated measurement of the specified voltage $U_i$.

FIG. 6 is a graph of the improvement in the time resolution $\Delta t$ of the method according to the invention on the basis of the repeated measurement of the specified voltage $U_i$, wherein m on the logarithmic x-axis in FIG. 6 denotes the number of measurements. By way of example, the jitter (fluctuations over time) of the time-to-digital converter 2 is assumed to be 2.4 ps in FIG. 6. As represented in FIG. 6, the time resolution of the method according to the invention and the device can be improved to below 1 ps with fewer than 50 measurements per specified voltage $U_i$.

LIST OF REFERENCE NUMBERS 1 measurement device
2 time-to-digital converter
3 comparator
4 microprocessor
5 memory
6 output unit
7 probe head
8 frequency divider
9 reference source
10 signal
11 signal divider
12 first electronic signal
13 second electronic signal

The invention claimed is:

1. A method for measuring an electronic signal by generating a measurement sequence for a sequence of recurring electronic signals comprising n reoccurrences of the electronic signal, the n reoccurrences of the electronic signal respectively denoted as i-th signals, where i=1 to n, and n is an integer greater than or equal to 2, wherein a time-to-digital converter is provided, wherein to generate the measurement sequence for the sequence of recurring electronic signals, a i-th voltage $U_i$ is specified and a time $t_i$ at which the i-th signal has the voltage $U_i$ is measured according to the following steps:

i) inputting the i-th signal into a first channel of the time-to-digital converter;
ii) specifying voltage $U_i$ and specifying a start time $t_{start\_i}$ for starting monitoring of the i-th signal;
iii) measuring the time $t_i$ at which the i-th signal has the specified $U_i$;
iv) storing in a memory values comprising the voltage $U_i$ and at least one of the measured time $t_i$, the start time $t_{start\_i}$ or the time difference between the start time $t_{start\_i}$ and the measured time $t_i$;
v) repeating steps i) to iv) using the i+1-th signal and a voltage $U_{i+1}$, until i+1=n or until the voltage $U_i$ specified in step iv) is greater than a maximum voltage $U_{max}$ of the electronic signal;
vi) reconstructing the electronic signal based on the values stored in the memory.

2. The method according to claim 1,
wherein
steps i) to iv) are repeated at the same voltage $U_i$ in an i-th signal for a rising flank and in an i+1-th signal for a falling flank.

3. The method according to claim 1,
wherein
the voltage $U_i$ is increased by increments after respective performances of step iii), and wherein the increments can be constant or non-constant.

4. The method according to claim 1,
wherein
in step iii) for measuring the time $t_i$, the voltage $U_i$ is compared with the i-th signal.

5. The method according to claim 1,
wherein
the time-to-digital converter establishes the time $t_i$ using a specified voltage threshold, which corresponds to the voltage $U_i$, or the time-to-digital converter establishes the time $t_i$ using a trigger signal of a comparator.

6. The method according to claim 1,
wherein
the voltage $U_i$ is specified by one of the time-to-digital converter, a reference source, or a digital-to-analog converter and is transmitted to the time-to-digital converter.

7. The method according to claim 1,
wherein
a plurality of time-to-digital converters is provided or one time-to-digital converter with a plurality of channels is provided and the method comprises inputting i-th signal into one of the plurality of time-to-digital converters or the one time-to-digital converter with a plurality of channels.

8. The method according to claim 1,
wherein
the i-th signal is input into the time-to-digital converter through a component upstream of the time-to-digital converter, the component comprising one of a filter, an amplifier, a signal divider, a power divider, or an attenuation member, and where each of the signal divider and power divider divides the i-th signal into two electronic signals, a first divided electronic signal and a second divided electronic signal.

9. The method according to claim 8,
wherein
the first divided electronic signal is fed into a first channel of the time-to-digital converter and the second divided electronic signal is fed into a second channel of the time-to-digital converter, or the second divided electronic signal is fed into a second time-to-digital converter.

10. The method according to claim 8,
wherein
the first and the second divided electronic signal are fed into the first channel of the time-to-digital converter by delaying the second divided electronic signal.

11. The method according to claim 1,
wherein in step ii), the start time $t_{start\_i}$ is specified by a start signal.

12. The method according to claim 1,
wherein
steps i) to iv) are repeated at the same voltage $U_i$ for a plurality of signals j, are repeated before step v), are repeated j times, in order to measure the times $t_{ij}$, where j=1 to m, and j is an integer greater than or equal to 2.

13. A device for measuring an electronic signal by generating a measurement sequence for a sequence of recurring electronic signals comprising n reoccurrences of the electronic signal, comprising a time-to-digital converter (TDC), a microprocessor connected to the TDC, a memory configured to be written to by the microprocessor and/or the TDC, a comparator arranged in or connected to the TDC, and an output unit,
wherein
the comparator measures whether the sequence of recurring electronic signals has a voltage $U_i$, and when the sequence of recurring electronic signals has the voltage $U_i$ the time-to-digital converter establishes a time $t_i$ at which the sequence of recurring electronic signals has the voltage $U_i$, and
wherein the voltage $U_i$ and the established time $t_i$ and/or a start time $t_{start\_i}$ is stored in the memory, and
wherein the microprocessor generates a reconstructed electronic signal by reconstructing the electronic signal on the basis of the values in the memory and sends the reconstructed electronic signal to the output unit and/or visually displays the reconstructed electronic signal.

14. The device according to claim 13,
wherein
the time-to-digital converter is formed as a component separate from the microprocessor, the memory, the comparator, and the output unit.

* * * * *